United States Patent
Li (10) Patent No.: US 10,224,889 B2
(45) Date of Patent: Mar. 5, 2019

(54) AUDIO OUTPUT CIRCUIT AND AUDIO DEVICE

(71) Applicant: Shenzhen China Star Optoelectronics Technology Co., Ltd., Shenzhen, Guangdong (CN)

(72) Inventor: Wendong Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 33 days.

(21) Appl. No.: 15/526,283

(22) PCT Filed: Feb. 20, 2017

(86) PCT No.: PCT/CN2017/074158
§ 371 (c)(1),
(2) Date: May 11, 2017

(87) PCT Pub. No.: WO2018/133155
PCT Pub. Date: Jul. 26, 2018

(65) Prior Publication Data
US 2018/0294787 A1 Oct. 11, 2018

(30) Foreign Application Priority Data
Jan. 22, 2017 (CN) .......................... 2017 1 0045579

(51) Int. Cl.
*H03G 3/22* (2006.01)
*H03F 3/181* (2006.01)
(Continued)

(52) U.S. Cl.
CPC .............. *H03G 3/22* (2013.01); *H03F 3/181* (2013.01); *H03F 3/22* (2013.01); *H04R 3/00* (2013.01);
(Continued)

(58) Field of Classification Search
CPC .... H03G 3/22; H03G 2201/103; H03F 3/181; H03F 3/22; H03F 2200/03
(Continued)

(56) References Cited

U.S. PATENT DOCUMENTS

2008/0137882 A1* 6/2008 Tsai .................. H03F 1/305
381/94.5
2009/0208032 A1 8/2009 Wu
2012/0014536 A1* 1/2012 Wang ................ H03F 1/305
381/106

FOREIGN PATENT DOCUMENTS

CN 201118786 Y 9/2008
CN 102118669 A 7/2011
(Continued)

*Primary Examiner* — William A Jerez Lora
(74) *Attorney, Agent, or Firm* — Andrew C. Cheng (57) ABSTRACT

The present disclosure discloses an audio output circuit including an audio power amplifier, a mute control circuit and a microcontroller, the audio power amplifier includes a power input terminal, a mute control terminal and an audio signal output terminal, the power input terminal is used to connect a power supply to obtain a power supply voltage, the mute control terminal is connected with the microcontroller through the mute control circuit and is grounded by a pull-down resistor, the audio signal output terminal is used to output an audio signal, the mute control circuit is also connected to the power supply for disconnecting the mute control terminal from the microcontroller when the power supply voltage is less than a preset voltage. The present disclosure also provides an audio device. According to the present disclosure, it is possible to effectively prevent the POP sound of the speaker of the audio device.

10 Claims, 5 Drawing Sheets

(51) Int. Cl.
*H03F 3/22* (2006.01)
*H04R 3/00* (2006.01)
(52) U.S. Cl.
CPC ... *H03F 2200/03* (2013.01); *H03G 2201/103* (2013.01); *H04R 2430/00* (2013.01)
(58) Field of Classification Search
USPC ........................................ 381/94.5; 330/174
See application file for complete search history.

(56) References Cited

FOREIGN PATENT DOCUMENTS

| | | |
|---|---|---|
| CN | 205693877 U | 11/2016 |
| JP | 2009152690 A | 7/2009 |

\* cited by examiner

AUDIO OUTPUT CIRCUIT AND AUDIO DEVICE

CROSS REFERENCE

The present disclosure claims the priority of No. 201710045579.7, entitled "audio output circuit and audio device", filed on Jan. 22, 2017, the disclosure of which is incorporated herein by reference in its entirety.

FIELD OF THE DISCLOSURE

The present disclosure relates to an audio device technology field, and more particularly to an audio output circuit and an audio device to which the audio output circuit is applied.

BACKGROUND OF THE DISCLOSURE

Figure 1:
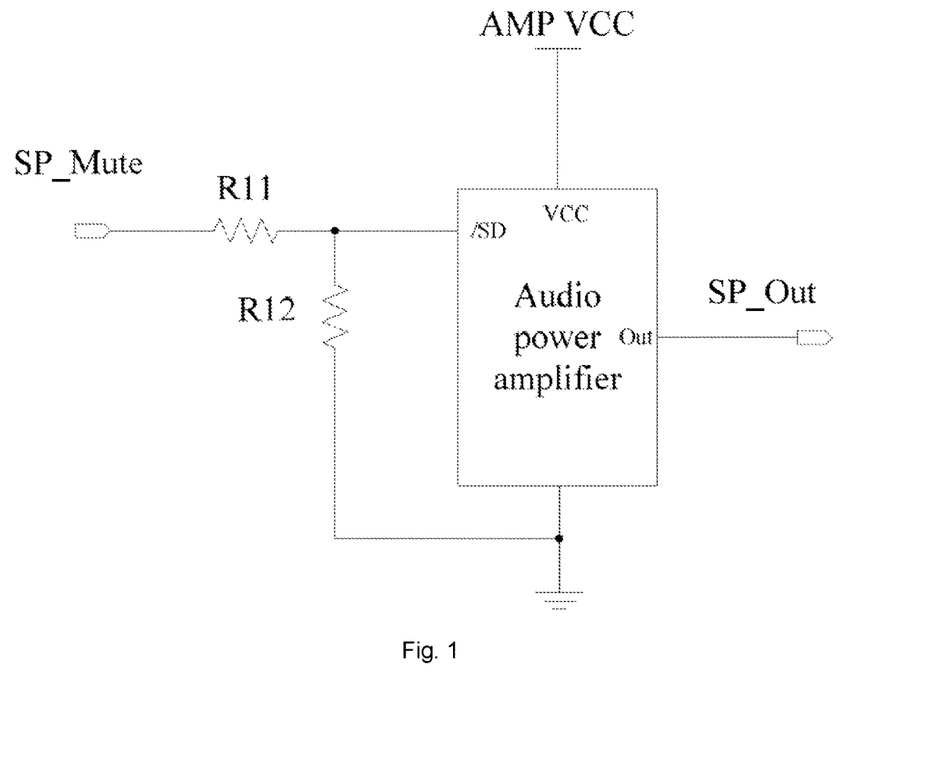
FIG. 1 is a schematic diagram of an audio output circuit of an audio device in the prior art.
Figure 2:
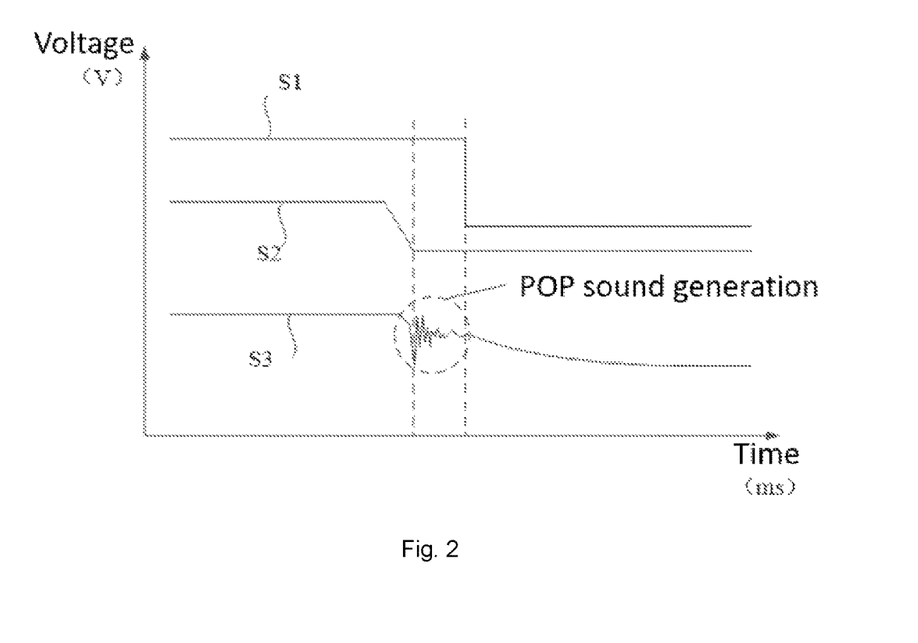
FIG. 2 is a schematic diagram of the control timing and output waveform of the audio output circuit of the prior art audio device.

Audio equipment in the power, power instantaneous and power stabilization, there may be a variety of transient noise is input to the audio power amplifier, amplified by the audio power amplifier by the speaker output, resulting in POP (blasting), seriously affecting the audio equipment, product quality and user experience. In general, the audio output circuit of the audio device is structured as shown in FIG. 1. Among them, SP_Mute is the mute control signal, can be provided by the audio device master chip, AMP VCC for the audio power amplifier power supply voltage, SP_Out is the audio signal output to the speaker, R11 and 12 are the resistances. At present, when the audio device is power on, the POP sound can be avoided through the master chip of the audio device controlling the power timing and mute control timing of the audio power amplifier. However, for audio equipment power off instantly, due to power off the audio device master chip power down and can not control the audio power amplifier timing and mute control timing, coupled with the hardware circuit design is unreasonable, may lead to power off instantaneous generation of POP sound. The control timing and output waveform of the audio output circuit of the audio equipment in the prior art are shown in FIG. 2. The curve S1 is the waveform of the mute control signal SP_Mute, the curve S2 is the waveform of the AMP VCC, and the curve S3 is the waveform of SP_Out. As can be seen from FIG. 2, after the audio device is powered off, the power supply voltage AMP VCC will gradually decline, In the AMP VCC down to a certain value, the master chip power is powered off, the mute control signal SP_Mute due to delay and still maintain a high level for a while, that is, the audio power amplifier is still in working condition, will be the master chip in the moment of power off the instantaneous pulse generated by the amplification and output to the speaker, resulting in POP sound generation.

SUMMARY OF THE DISCLOSURE

The disclosure provides an audio output circuit and an audio device to realize the mute control of the audio device power off instantly, prevent the generation of the POP sound and enhance the product quality and the user experience of the audio equipment.

An audio output circuit includes an audio power amplifier, a mute control circuit and a micro controller, the audio power amplifier includes a power input terminal, a mute control terminal and an audio signal output terminal, the power input terminal is used to connect a power supply to obtain a power supply voltage, the mute control terminal is connected with the micro controller through the mute control circuit and is grounded by a pull-down resistor, the audio signal output terminal is used to output an audio signal, the mute control circuit is also connected to the power supply for disconnecting the mute control terminal from the micro controller when the power supply voltage is less than a preset voltage.

Wherein, the mute control circuit is further configured to turn on the connection between the mute control terminal and the microcontroller when the power supply voltage is greater than or equal to the preset voltage.

Wherein, the mute control circuit includes a Zener diode, a first switch tube, a second switch tube, a first resistor, a second resistor, a third resistor, a fourth resistor and a fifth resistor, the negative electrode of the Zener diode is connected with the power source, the positive electrode of the Zener diode is connected to the base of the first switch tube through the first resistor, the base of the first switch tube is also grounded through the second resistor, the emitter of the first switch tube is grounded, the collector of the first switch tube is connected to the base of the second switch tube through the third resistor, the base of the second switch tube is also connected to the emitter of the second switch tube through the fourth resistor, the emitter of the second switch tube is also connected to the microcontroller through the fifth resistor, and the collector of the second switch tube is connected with the mute control terminal.

Wherein, if the power supply voltage is greater than or equal to the preset voltage, the Zener diode is operated in a reverse breakdown state, the first switch tube is turned on; if the micro controller outputs a high level, the second switch tube is turned on, the connection between the mute control terminal and the micro controller is turned on, and the audio power amplifier is normally operated; If the micro controller outputs a low level, the second switch tube is turned off and the connection between the mute control terminal and the micro controller is turned off, the level of the mute control terminal goes low under the action of the pull-down resistor, and the audio power amplifier stops outputting the audio signal.

Wherein, if the power supply voltage is smaller than the preset voltage, the Zener diode is operated in the reverse off state, and the first switch tube and the second switch tube are turned off, the connection between the mute control terminal and the micro controller is turned off and the level of the mute control terminal goes low under the action of the pull-down resistor to control the audio power amplifier to stop outputting audio signal.

Wherein, the preset voltage being greater than or equal to a stable voltage of the Zener diode.

An audio device includes an audio power amplifier, a mute control circuit, a micro controller, a power supply and a speaker, the audio power amplifier includes a power input terminal, a mute control terminal and an audio signal output terminal, the power input terminal is connected with the power supply to obtain a power supply voltage, the mute control terminal is connected with the micro controller through the mute control circuit and is grounded by a pull-down resistor, the audio signal output terminal is connected with the micro controller to output an audio signal, the mute control circuit is also connected to the power supply for disconnecting the mute control terminal from the micro controller when the power supply voltage is less than a preset voltage.

Wherein, the mute control circuit is further configured to turn on the connection between the mute control terminal and the microcontroller when the power supply voltage is greater than or equal to the preset voltage.

Wherein, the mute control circuit includes a Zener diode, a first switch tube, a second switch tube, a first resistor, a second resistor, a third resistor, a fourth resistor and a fifth resistor, the negative electrode of the Zener diode is connected with the power source, the positive electrode of the Zener diode is connected to the base of the first switch tube through the first resistor, the base of the first switch tube is also grounded through the second resistor, the emitter of the first switch tube is grounded, the collector of the first switch tube is connected to the base of the second switch tube through the third resistor, the base of the second switch tube is also connected to the emitter of the second switch tube through the fourth resistor, the emitter of the second switch tube is also connected to the microcontroller through the fifth resistor, and the collector of the second switch tube is connected with the mute control terminal.

Wherein, if the power supply voltage is greater than or equal to the preset voltage, the Zener diode is operated in a reverse breakdown state, the first switch tube is turned on; if the micro controller outputs a high level, the second switch tube is turned on, the connection between the mute control terminal and the micro controller is turned on, and the audio power amplifier is normally operated; If the micro controller outputs a low level, the second switch tube is turned off and the connection between the mute control terminal and the micro controller is turned off, the level of the mute control terminal goes low under the action of the pull-down resistor, and the audio power amplifier stops outputting the audio signal.

Wherein, if the power supply voltage is smaller than the preset voltage, the Zener diode is operated in the reverse off state, and the first switch tube and the second switch tube are turned off, the connection between the mute control terminal and the micro controller is turned off and the level of the mute control terminal goes low under the action of the pull-down resistor to control the audio power amplifier to stop outputting audio signal.

Wherein, the preset voltage being greater than or equal to a stable voltage of the Zener diode.

The audio output circuit of the present disclosure is provided by providing a mute control circuit between the mute control terminal of the audio power amplifier and the micro controller and connecting the mute control circuit with the power supply of the audio power amplifier, and then when the power supply voltage is less than the preset voltage, the mute control circuit disconnects the connection between the mute control terminal and the microcontroller so that the level of the mute control terminal is pulled low by the action of the pull-down resistor so as to control the audio power amplifier to stop the output of audio signals, can effectively prevent the audio device in the power off instantly produce POP sound, is conducive to enhance the audio equipment, product quality and user experience.

BRIEF DESCRIPTION OF THE DRAWINGS

In order to more clearly illustrate the embodiments of the present disclosure or the technical solutions in the prior art, the following drawings, which are to be used in the description of the embodiments or the prior art, will be briefly described. It will be apparent that the drawings in the following description are some embodiments of the present disclosure, and for the benefit of one of ordinary skill in the art, other drawings may be obtained from these drawings without departing from the creative work.

DETAILED DESCRIPTION OF PREFERRED EMBODIMENTS

The embodiments described in the embodiments of the present disclosure will now be described in conjunction with the accompanying drawings in the embodiments of the present disclosure, and it will be apparent that the described embodiments are merely part of the embodiments of the disclosure and are not intended to be exhaustive. All other embodiments obtained by those of ordinary skill in the art without making creative work are within the scope of the present disclosure, based on embodiments in the present disclosure.

For ease of description, it can be used here, such as "beneath, . . . ", " . . . in the below," "lower," "above in . . . ", "upper" and other terms to describe relative spatial shown in FIG. the one element or another feature (s) as elements or features. Be understood that when an element or layer is referred to another element or layer "on", "connected to" or "coupled to" another element or layer, it can be directly on another element or layer, directly connected or coupled to the other element or layer or intervening elements or layers may be present. In contrast, when an element is referred to as being "directly on" another element or layer, "directly connected to" or when "directly coupled to" another element or layer, no intervening elements or layers present.

Will be appreciated, the terminology used herein is for describing particular embodiments only case, not intended to limit the present disclosure. When used herein, unless the context otherwise expressly stated herein, the singular forms "a" and "the" are intended to include the plural forms. Further, when used in this specification, the term "includes" and/or "including" indicates that the presence of features, integers, steps, components, and/or components, but do not exclude one or more other features, integers, steps, elements, components, and/or combinations of the presence or addition.

Unless otherwise defined, all terms the same meanings as used herein (including technical and scientific terms) have ordinary skill in the art to which this disclosure as commonly understood. Will be further understood that terms such as Universal Dictionary defined otherwise, should be interpreted as having a meaning in the context of the relevant art is consistent with their meaning and should not be interpreted in an idealized or overly formal sense, unless expressly so defined.

Figure 3:
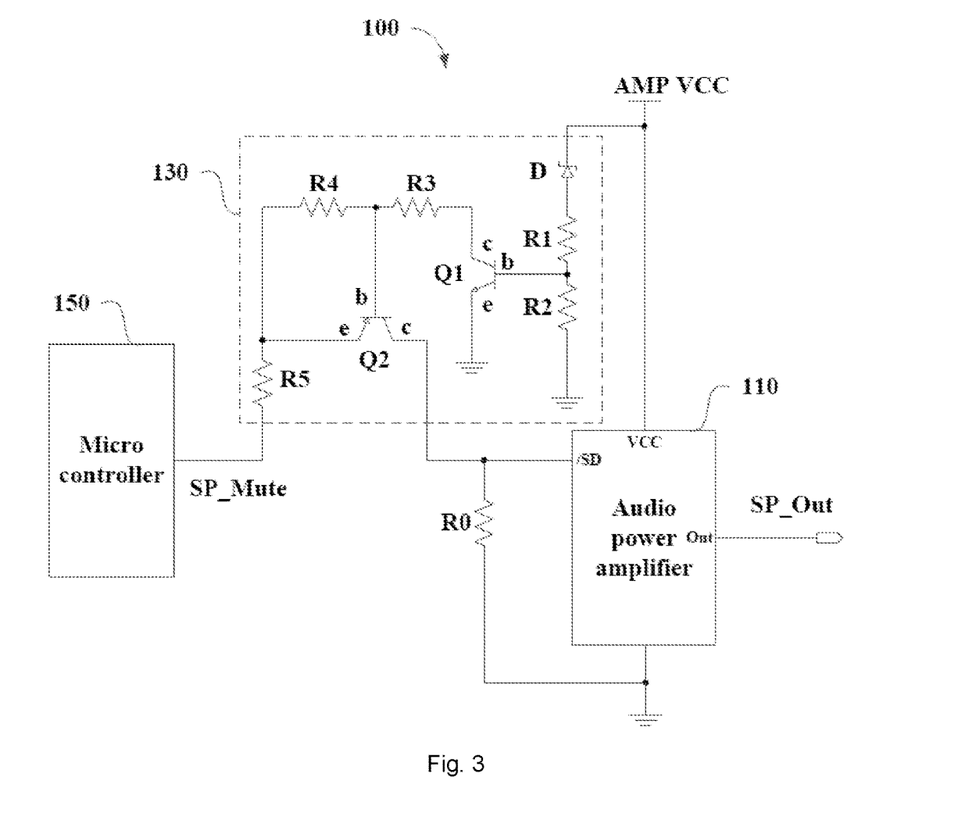
FIG. 3 is a schematic structural view of an audio output circuit provided by an embodiment of the present disclosure.

As shown in FIG. 3, in one embodiment of the present disclosure, there is provided an audio output circuit 100 including an audio power amplifier 110, a mute control circuit 130 and a micro controller 150, the audio power amplifier 110 includes a power input terminal VCC, a mute control terminal /SD and an audio signal output terminal Out, the power input terminal VCC is used to connect a power supply AMP_VCC to obtain a power supply voltage, the mute control terminal /SD is connected with the micro controller 150 through the mute control circuit 130 and is grounded by a pull-down resistor R0, the audio signal output terminal Out is used to output an audio signal, the mute control circuit 130 is also connected to the power supply AMP_VCC for turning on the connection between the mute control terminal /SD and the microcontroller 150 when the power supply voltage is greater than or equal to the preset voltage, and for disconnecting the mute control terminal /SD from the micro controller 150 when the power supply voltage is less than a preset voltage.

It will be appreciated that, when the power supply AMP_VCC is operating normally, the power supply voltage is always greater than the preset voltage, the mute control circuit 130 turns on the connection between the mute control terminal /SD and the micro controller 150, the mute control circuit 130 outputs a corresponding level signal to the mute controller terminal /SD of the audio power amplifier 110 in accordance with the high and low levels of the output level of the microcontroller 150, specifically, when the micro controller 150 outputs a high level, the mute control circuit 130 outputs a high level to the mute controller terminal /SD of the audio power amplifier 110, when the micro controller 150 outputs a low level, the mute control circuit 130 outputs a low level to the mute controller terminal /SD of the audio power amplifier 110.

When the audio device corresponding to the audio output circuit 100 is powered off, the microcontroller 110 can not immediately control the level of the mute control terminal /SD to a low level in the power-down state, that is, the level of the mute control terminal /SD is switched from the high level to the low level there is a certain delay period. At the same time, since the power supply voltage outputted from the power supply AMP_VCC is gradually decreased after the audio apparatus is powered down, however, if there is a noise signal (for example, a noise signal generated when the micro controller 150 is de-energized) in the audio output circuit 100 before dropping to a certain voltage, and the mute control terminal /SD is high, the noise signal is amplified by the audio power amplifier 110 and output to the speaker, thereby forming a POP sound, i.e., a blasting sound. In the present embodiment, the power supply voltage outputted from the power supply AMP_VCC is monitored by the mute control circuit 130 in order to prevent the audio output circuit 100 appearing the POP sound at the moment when the audio device is powered off, and disconnecting the mute control terminal /SD from the micro-controller 150 when the power supply voltage is less than the preset voltage, so that the mute control terminal /SD is locked at a low level by the pull-down of the pull-down resistor R0, that is, the audio power amplifier 110 does not have an audio signal output and the speaker is muted.

In the present embodiment, the mute control circuit 130 includes a Zener diode D, a first switch tube Q1, a second switch tube Q2, a first resistor R1, a second resistor R2, a third resistor R3, a fourth resistor R4 and a fifth resistor R5, the negative electrode of the Zener diode D is connected with the power source AMP_VCC, the positive electrode of the Zener diode D is connected to the base b of the first switch tube Q1 through the first resistor R1, the base b of the first switch tube Q1 is also grounded through the second resistor R2, the emitter e of the first switch tube Q1 is grounded, the collector c of the first switch tube Q1 is connected to the base b of the second switch tube Q2 through the third resistor R3, the base b of the second switch tube Q2 is also connected to the emitter e of the second switch tube Q2 through the fourth resistor R4, the emitter e of the second switch tube Q2 is also connected to the microcontroller 150 through the fifth resistor R5, and the collector c of the second switch tube Q2 is connected with the mute control terminal /SD.

In one embodiment, if the power supply voltage is greater than or equal to the preset voltage, the Zener diode D operates in a reverse breakdown state so as to form a positive bias between the base b and the emitter e of the first switch tube Q1, the first switch tube Q1 is turned on, the level of the base b of the second switch tube Q2 is pulled low. At this time, if the micro controller 150 outputs a high level, a reverse bias is formed between the base b and the emitter e of the second switch tube Q2, and the second switch tube Q2 is turned on, thereby causing the connection between the mute control terminal /SD and the micro controller 150 to be turned on, the collector c of the second switch tube Q2 is at a high level, that is, the mute control terminal /SD is at a high level to control the switching of the audio power amplifier 110 into a normal operation mode. If the micro controller 150 outputs a low level, both the base b and the emitter e of the second switch tube Q2 are at a low level, the second switch tube Q2 is turned off, and the connection between the mute control terminal /SD and the micro controller 150 is turned off, the level of the mute control terminal /SD goes low under the action of the pull-down resistor R0 to control the audio power amplifier 110 to switch to the mute mode and stop the output of the audio signal.

In one embodiment, if the power supply voltage is less than the preset voltage, the Zener diode D operates in a reverse off state, both the first switch tube Q1 and the second switch tube Q2 are turned off and the connection between the mute control terminal /SD and the micro controller 150 is turned off, the level of the mute control terminal /SD goes low under the action of the pull-down resistor R0 to control the audio power amplifier 110 to switch to the silent mode and stop the output of the audio signal.

It will be appreciated that the preset voltage is greater than or equal to the stabilized voltage of the Zener diode D. In the present embodiment, when the power supply AMP_VCC is in normal operation, the output power supply voltage is 13 V, and the stable voltage of the Zener diode D is 9.1 V, that is, the reverse breakdown voltage is 9.1 V. When the power supply AMP_VCC is normally operated, the Zener diode D operates in the reverse breakdown state, a positive bias is formed between the base b and the emitter e of the first switch tube Q1 so that the first switch tube Q1 is turned on, further, the conduction of the first switch Q1 causes the level of the base b of the second switch tube Q2 to be pulled low, at this time, if the micro controller 150 outputs a high level, a reverse bias is formed between the base b and the emitter e of the second switch tube Q2, and the second switch tube Q2 is also turned on, the connection between the mute control terminal /SD and the micro controller 150 is turned on. When the audio device corresponding to the audio output circuit 100 is de-energized, the power supply voltage outputted by the power supply AMP_VCC gradually decreases, when the power supply voltage drops to 9.1 V, the Zener diode D is operated in the reverse off state, and the first switch Q1 and the second switch Q2 are turned off, the connection between the mute control terminal /SD and the micro-controller 150 is turned off, the mute control terminal /SD is pulled down to a low level, thereby controlling the audio power amplifier 110 to switch to the mute mode and stopping the output of the audio signal.

Figure 4:
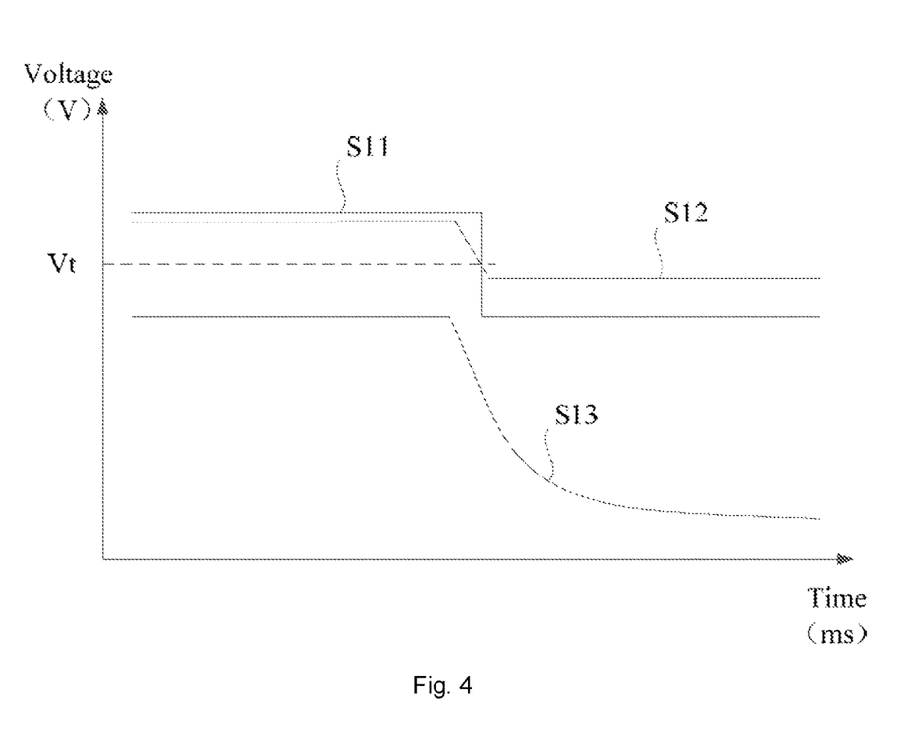
FIG. 4 is a schematic diagram of control timing and output waveform of an audio output circuit provided by an embodiment of the present disclosure.

Please refer to FIG. 4, FIG. 4 is a control timing and an output waveform diagram of the audio output circuit 100 provided for the embodiment of the present disclosure, wherein, the curve S11 is the level change waveform of the mute control terminal /SD, S12 is the waveform of the power supply voltage outputted from the power source AMP_VCC, Vt is the preset voltage (9.1 V in the present embodiment), S13 is a waveform of the audio signal SP_Out output from the audio power amplifier 110. As can be seen from FIG. 4, when the power supply voltage S12 drops below the preset voltage Vt, the level of the mute control terminal /SD is lowered from the high level to the low level, thereby controlling the audio power amplifier 110 to stop outputting the audio signal. It will be appreciated that the magnitude of the preset voltage Vt may be adjusted according to the different circuit application requirements by selecting a regulated voltage regulator of different specifications by ensuring that the preset voltage Vt is greater than the power down voltage of the microcontroller 150, the connection between the mute control terminal /SD and the micro controller 150 can be disconnected by the mute control circuit 130 before the micro controller 150 is powered down, and the mute control terminal /SD is pulled low by the pull-down resistor R0 so that the audio output circuit 100 can effectively prevent the audio sound of the audio device and the user experience.

Figure 5:
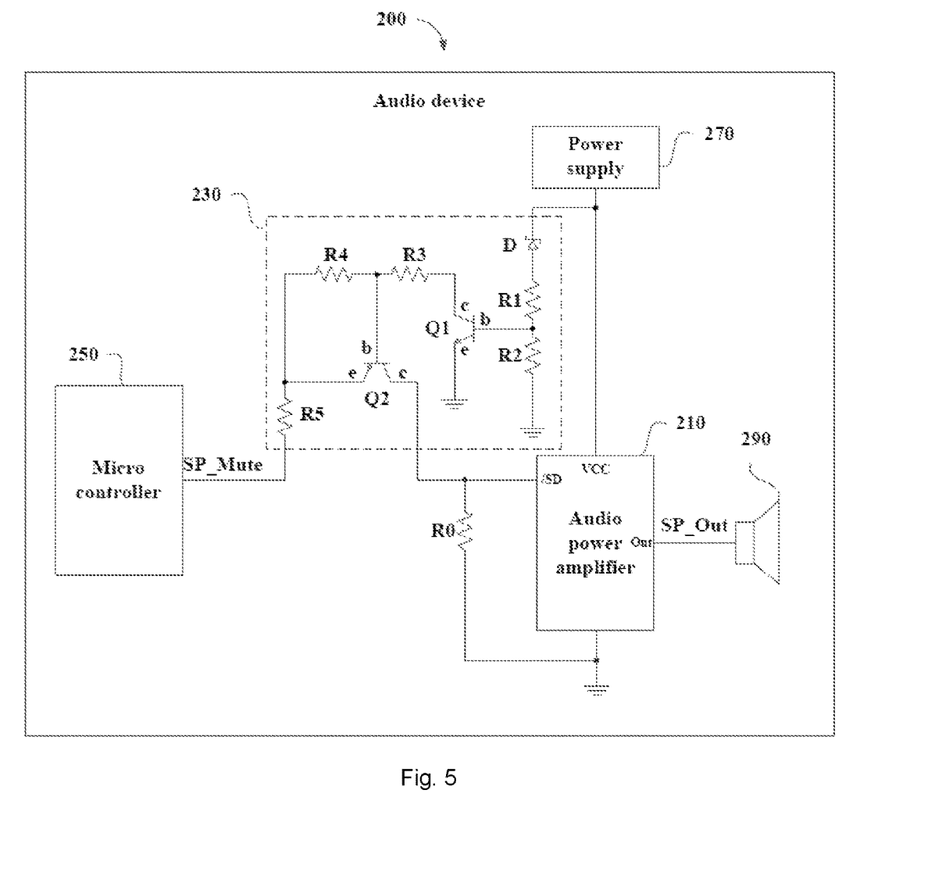
FIG. 5 is a schematic structural view of an audio device according to an embodiment of the present disclosure.

Referring to FIG. 5, in one embodiment of the present disclosure, There is provided an audio device 200 including an audio power amplifier 210, a mute control circuit 230, a micro controller 250, a power supply 270, and a speaker 290, The audio power amplifier 210 includes a power supply input terminal VCC, a mute control terminal /SD and an audio signal output terminal Out, the power supply input terminal VCC is connected to the power source 270 to obtain a power supply voltage, the mute control terminal /SD is connected to the micro controller 250 through the mute control circuit 230 and is grounded by a pull-down resistor R0, the audio signal output terminal Out is connected to the speaker 290 for outputting an audio signal, the mute control circuit 230 is also connected to the power source 270 for turning on the connection between the mute control terminal /SD and the micro controller 250 when the power supply voltage is greater than or equal to a preset voltage, and disconnecting the mute control terminal /SD from the microcontroller 250 when the power supply voltage is less than the preset voltage.

The configuration and function of the mute control circuit 230 are the same as those of the mute control circuit 130 in the embodiment shown in FIGS. 3 to 4, specifically, reference may be made to the description in the embodiments shown in FIGS. 3 to 4, and will not be described here. It will be appreciated that the audio device 200 may be, but is not limited to, an audio device, a liquid crystal television, or the like.

The mute control circuit 130 is arranged on the audio output circuit 100 between the mute control terminal /SD of the audio power amplifier 110 and the microcontroller 150, and connects the mute control circuit 130 to the power source of the audio power amplifier 110, and the power supply voltage at the audio power amplifier 110 is greater than or equal to the preset voltage, and the microcontroller 150 outputs a high level, the connection between the mute control terminal /SD and the microcontroller 150 is turned on and the power supply voltage of the audio power amplifier is greater than or equal to the preset voltage, and the microcontroller 150 outputs a low level, disconnecting the mute control terminal /SD from the micro-controller 150, to ensure that the audio power amplifier 110 can operate normally or stop outputting the audio signal under the control of the microcontroller 150, and disconnecting the mute control terminal /SD from the micro-controller 150 when the power supply voltage is less than the preset voltage, so that the level of the mute control terminal /SD is pulled down by the pull-down resistor R0 to control the audio power amplifier 110 to stop outputting the audio signal, can effectively prevent the audio device in the power off moment to produce POP sound, is conducive to enhance the audio equipment, product quality and user experience.

Disclosed above is only a preferred embodiment of the present disclosure only, of course, not in order to define the scope of rights of the present disclosure, those of ordinary skill in achieving the above embodiments can be understood that all or part of the process, and in accordance with the disclosure of claim made identical change, which is still covered by the scope of the disclosure.

What is claimed is:

1. An audio output circuit comprises an audio power amplifier, a mute control circuit and a micro controller, the audio power amplifier comprises a power input terminal, a mute control terminal and an audio signal output terminal, the power input terminal is used to connect a power supply to obtain a power supply voltage, the mute control terminal is connected with the micro controller through the mute control circuit and is grounded by a pull-down resistor, the audio signal output terminal is used to output an audio signal, the mute control circuit is also connected to the power supply for disconnecting the mute control terminal from the micro controller when the power supply voltage is less than a preset voltage; wherein, the mute control circuit comprises a Zener diode, a first switch tube, a second switch tube, a first resistor, a second resistor, a third resistor, a fourth resistor and a fifth resistor, the negative electrode of the Zener diode is connected with the power source, the positive electrode of the Zener diode is connected to the base of the first switch tube through the first resistor, the base of the first switch tube is also grounded through the second resistor, the emitter of the first switch tube is grounded, the collector of the first switch tube is connected to the base of the second switch tube through the third resistor, the base of the second switch tube is also connected to the emitter of the second switch tube through the fourth resistor, the emitter of the second switch tube is also connected to the microcontroller through the fifth resistor, and the collector of the second switch tube is connected with the mute control terminal.

2. The audio output circuit according to claim 1, wherein, the mute control circuit is further configured to turn on the connection between the mute control terminal and the microcontroller when the power supply voltage is greater than or equal to the preset voltage.

3. The audio output circuit according to claim 1, wherein, if the power supply voltage is greater than or equal to the preset voltage, the Zener diode is operated in a reverse breakdown state, the first switch tube is turned on; if the micro controller outputs a high level voltage, the second switch tube is turned on, the connection between the mute control terminal and the micro controller is turned on, and the audio power amplifier is normally operated; If the micro controller outputs a low level voltage, the second switch tube is turned off and the connection between the mute control terminal and the micro controller is turned off, the level voltage of the mute control terminal goes low under the action of the pull-down resistor, and the audio power amplifier stops outputting the audio signal.

4. The audio output circuit according to claim 1, wherein, if the power supply voltage is smaller than the preset voltage, the Zener diode is operated in the reverse off state, and the first switch tube and the second switch tube are turned off, the connection between the mute control terminal and the micro controller is turned off and the level voltage of the mute control terminal goes low under the action of the pull-down resistor to control the audio power amplifier to stop outputting audio signal.

5. The audio output circuit according to claim 1, wherein, the preset voltage being greater than or equal to a stable voltage of the Zener diode.

6. An audio device comprises an audio power amplifier, a mute control circuit, a micro controller, a power supply and a speaker, the audio power amplifier comprises a power input terminal, a mute control terminal and an audio signal output terminal, the power input terminal is connected with the power supply to obtain a power supply voltage, the mute control terminal is connected with the micro controller through the mute control circuit and is grounded by a pull-down resistor, the audio signal output terminal is connected with the speaker to output an audio signal, the mute control circuit is also connected to the power supply for disconnecting the mute control terminal from the micro controller when the power supply voltage is less than a preset voltage; wherein, the mute control circuit comprises a Zener diode, a first switch tube, a second switch tube, a first resistor, a second resistor, a third resistor, a fourth resistor and a fifth resistor, the negative electrode of the Zener diode is connected with the power source, the positive electrode of the Zener diode is connected to the base of the first switch tube through the first resistor, the base of the first switch tube is also grounded through the second resistor, the emitter of the first switch tube is grounded, the collector of the first switch tube is connected to the base of the second switch tube through the third resistor, the base of the second switch tube is also connected to the emitter of the second switch tube through the fourth resistor, the emitter of the second switch tube is also connected to the microcontroller through the fifth resistor, and the collector of the second switch tube is connected with the mute control terminal.

7. The audio device according to claim 6, wherein, the mute control circuit is further configured to turn on the connection between the mute control terminal and the microcontroller when the power supply voltage is greater than or equal to the preset voltage.

8. The audio device according to claim 6, wherein, if the power supply voltage is greater than or equal to the preset voltage, the Zener diode is operated in a reverse breakdown state, the first switch tube is turned on; if the micro controller outputs a high level voltage, the second switch tube is turned on, the connection between the mute control terminal and the micro controller is turned on, and the audio power amplifier is normally operated; If the micro controller outputs a low level voltage, the second switch tube is turned off and the connection between the mute control terminal and the micro controller is turned off, the level voltage of the mute control terminal goes low under the action of the pull-down resistor, and the audio power amplifier stops outputting the audio signal.

9. The audio device according to claim 6, wherein, if the power supply voltage is smaller than the preset voltage, the Zener diode is operated in the reverse off state, and the first switch tube and the second switch tube are turned off, the connection between the mute control terminal and the micro controller is turned off and the level voltage of the mute control terminal goes low under the action of the pull-down resistor to control the audio power amplifier to stop outputting audio signal.

10. The audio device according to claim 6, wherein, the preset voltage being greater than or equal to a stable voltage of the Zener diode.

\* \* \* \* \*